United States Patent
Hong et al.

(10) Patent No.: US 11,986,921 B2
(45) Date of Patent: May 21, 2024

(54) CHEMICAL MECHANICAL POLISHING APPARATUS, CHEMICAL MECHANICAL POLISHING METHOD AND METHOD FOR FABRICATING SEMICONDUCTOR DEVICE

(71) Applicant: SAMSUNG ELECTRONICS CO., LTD., Suwon-si (KR)

(72) Inventors: Myung-Ki Hong, Uiwang-si (KR); Yong Hee Lee, Seoul (KR); Byoung Ho Kwon, Changwon-si (KR); Kun Tack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 341 days.

(21) Appl. No.: 17/401,105

(22) Filed: Aug. 12, 2021

(65) Prior Publication Data

US 2022/0118582 A1 Apr. 21, 2022

(30) Foreign Application Priority Data

Oct. 16, 2020 (KR) .................. 10-2020-0133978

(51) Int. Cl.
| | | |
|---|---|---|
| B24B 37/015 | (2012.01) | |
| B24B 37/20 | (2012.01) | |
| B24B 53/017 | (2012.01) | |
| H01L 21/306 | (2006.01) | |
| H01L 21/67 | (2006.01) | |

(52) U.S. Cl.
CPC .......... *B24B 37/015* (2013.01); *B24B 37/20* (2013.01); *B24B 53/017* (2013.01); *H01L 21/30625* (2013.01); *H01L 21/67219* (2013.01)

(58) Field of Classification Search
None
See application file for complete search history.

(56) References Cited

U.S. PATENT DOCUMENTS

| | | |
|---|---|---|
| 8,575,030 B2 | 11/2013 | Minamihaba et al. |
| 9,233,448 B2 | 1/2016 | Motoshima et al. |
| 9,579,768 B2 | 2/2017 | Motoshima et al. |
| 2010/0015894 A1* | 1/2010 | Ho ................. B24B 37/015 451/289 |
| 2011/0081832 A1 | 4/2011 | Nakamura et al. |
| 2012/0190273 A1 | 7/2012 | Ono et al. |
| 2012/0220195 A1* | 8/2012 | Gawase ............ B24B 37/24 451/7 |
| 2019/0054690 A1 | 2/2019 | Huang et al. |

FOREIGN PATENT DOCUMENTS

| | | |
|---|---|---|
| KR | 10-2009-0052981 | 5/2009 |
| KR | 10-2016-0115394 | 10/2016 |
| KR | 10-2019-0058939 | 5/2019 |

* cited by examiner

*Primary Examiner* — Roberts P Culbert
(74) *Attorney, Agent, or Firm* — F. CHAU & ASSOCIATES, LLC

(57) ABSTRACT

A chemical mechanical polishing method is provided. A chemical mechanical polishing method comprising providing a polishing pad, supplying a first purging compound having a first temperature onto the polishing pad, supplying a first slurry having a third temperature onto the polishing pad supplied with the first purging compound, supplying a second purging compound having a second temperature lower than the first temperature onto the polishing pad, and supplying a second slurry having a fourth temperature lower than the third temperature onto the polishing pad supplied with the second purging compound.

17 Claims, 19 Drawing Sheets

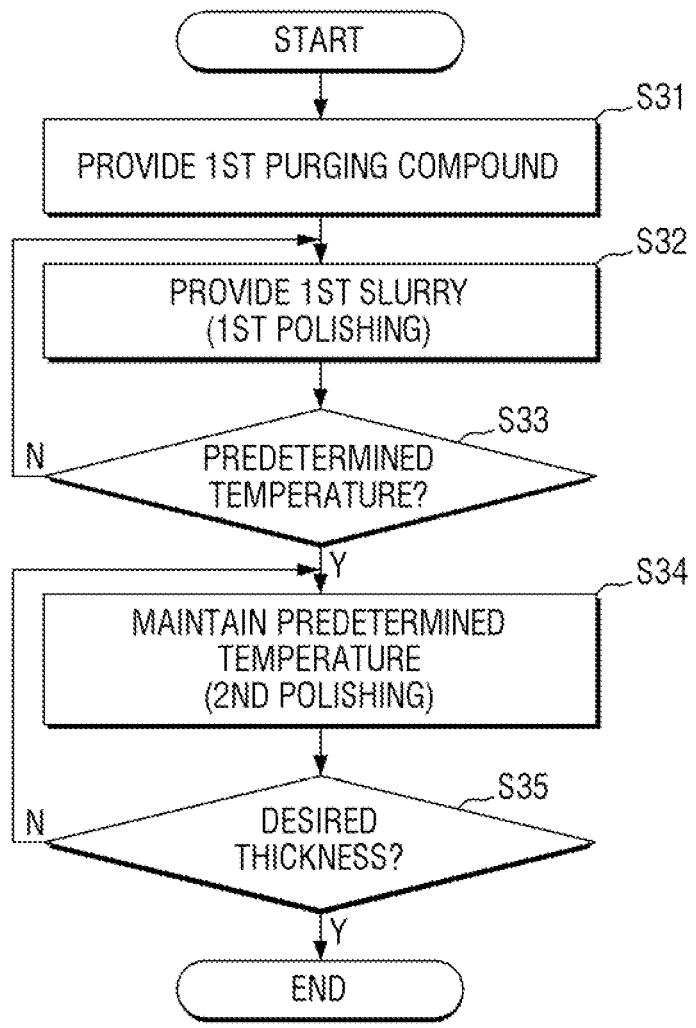

CHEMICAL MECHANICAL POLISHING APPARATUS, CHEMICAL MECHANICAL POLISHING METHOD AND METHOD FOR FABRICATING SEMICONDUCTOR DEVICE

CROSS-REFERENCE TO RELATED APPLICATION

This application claims priority to Korean Patent Application No. 10-2020-0133978, filed on Oct. 16, 2020 in the Korean Intellectual Property Office, and all the benefits accruing therefrom under 35 U.S.C. § 119, the contents of which are herein incorporated by reference in its entirety.

TECHNICAL FIELD

The present disclosure relates to a polishing apparatus and, more particularly, to a chemical mechanical polishing apparatus, a chemical mechanical polishing method, and a method for fabricating a semiconductor device.

DISCUSSION OF THE RELATED ART

In a process of fabricating a semiconductor device, a chemical mechanical polishing (CMP) process is widely used as a planarization technique for removing a step between layers formed on a substrate. The chemical mechanical polishing process may efficiently planarize the layers formed on the substrate by injecting a slurry composition, including abrasive particles, between the substrate and the polishing pad and rubbing the substrate with the polishing pad.

Such a chemical mechanical polishing process may be prone to generating heat due to friction between the substrate and the polishing pad, and this frictional heat increases the polishing temperature and causes a change in the polishing rate of the chemical mechanical polishing process.

SUMMARY

A chemical mechanical polishing method includes providing a polishing pad, supplying a first purging compound having a first purging temperature (or simply, a "first temperature") onto the polishing pad, supplying a first slurry having a first slurry temperature (or simply, a "third temperature") onto the polishing pad supplied with the first purging compound, supplying a second purging compound having a second purging temperature (or simply, a "second temperature") lower than the first purging temperature onto the polishing pad, and supplying a second slurry having a second slurry temperature (or simply, a "fourth temperature") lower than the first slurry temperature onto the polishing pad supplied with the second purging compound.

A chemical mechanical polishing method incudes providing a polishing pad, supplying a first purging compound having a first purging temperature onto the polishing pad, performing a first polishing process on a wafer using the polishing pad supplied with the first purging compound, after performing the first polishing process, supplying a second purging compound having a second purging temperature lower than the first purging temperature onto the polishing pad, and performing a second polishing process on the wafer using the polishing pad supplied with the second purging compound.

A chemical mechanical polishing apparatus includes a rotatable polishing pad, a polishing head configured to provide a wafer on the polishing pad, a purging compound supply unit configured to supply at least one of a first purging compound having a first purging temperature or a second purging compound having a second purging temperature lower than the first purging temperature onto the polishing pad, and a slurry supply unit configured to supply a slurry onto the polishing pad to which at least one of the first purging compound or the second purging compound is supplied.

A method for fabricating a semiconductor device includes forming a material pattern including a plurality of trenches on a substrate, forming a target layer filling the plurality of trenches on the material pattern, providing a polishing pad, supplying a first purging compound having a first purging temperature onto the polishing pad, performing a first polishing process on the target layer using the polishing pad supplied with the first purging compound, after performing the first polishing process, supplying a second purging compound having a second purging temperature lower than the first purging temperature onto the polishing pad, and performing a second polishing process on the target layer using the polishing pad supplied with the second purging compound.

BRIEF DESCRIPTION OF THE DRAWINGS

The above and other aspects and features of the present disclosure will become more apparent by describing in detail exemplary embodiments thereof with reference to the attached drawings, in which:

FIG. 19 is a flowchart illustrating a chemical mechanical polishing method according to some embodiments of the present disclosure.

DETAILED DESCRIPTION OF THE EMBODIMENTS

Hereinafter, a chemical mechanical polishing apparatus according to exemplary embodiments is described with reference to FIGS. 1 to 12.

Figure 1:
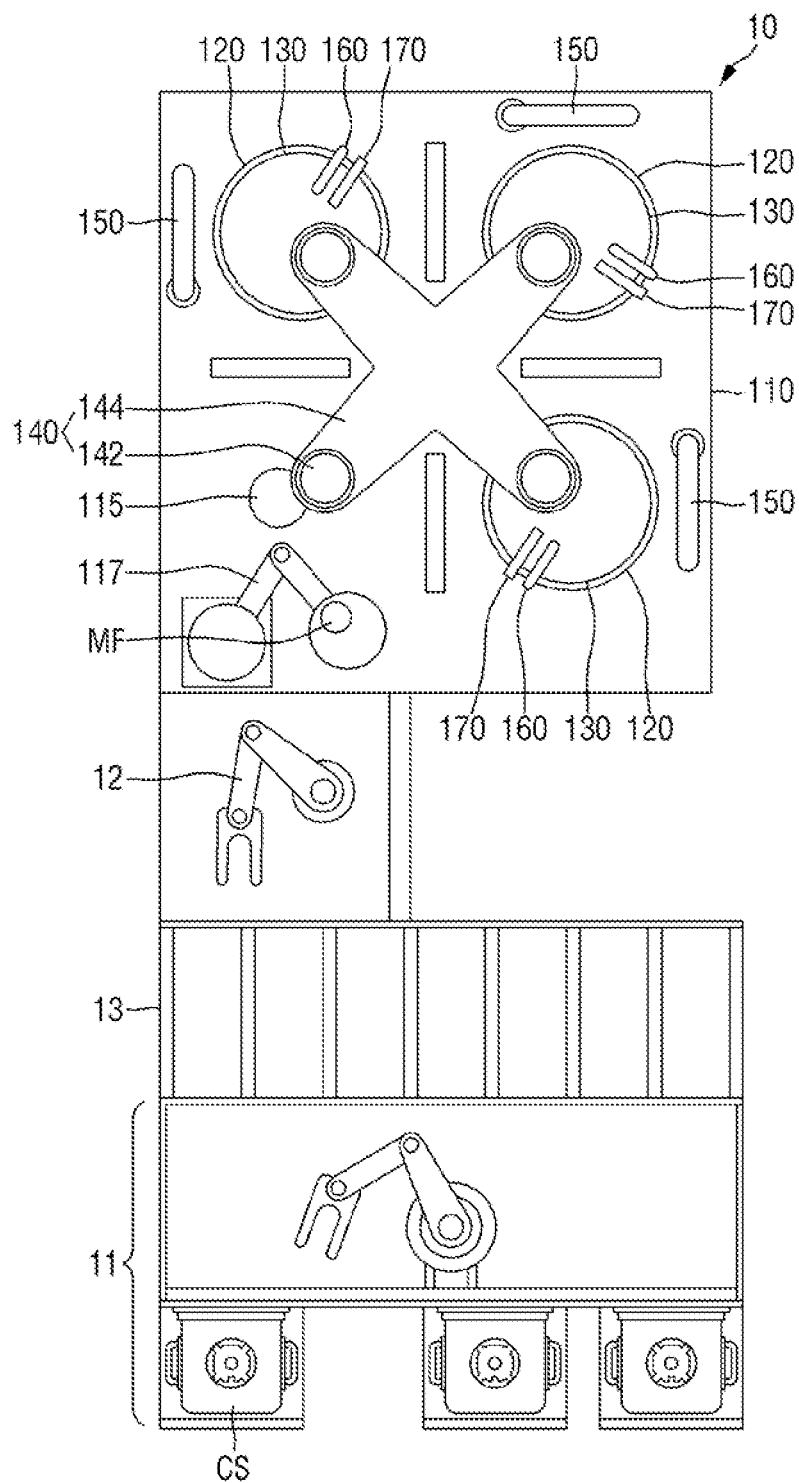
FIG. 1 is a schematic plan view illustrating a polishing facility including a chemical mechanical polishing apparatus according to some embodiments of the present disclosure.

FIG. 1 is a schematic plan view illustrating a polishing facility including a chemical mechanical polishing apparatus according to some embodiments of the present disclosure.

Referring to FIG. 1, a polishing facility, according to some embodiments of the present disclosure, may include a chemical mechanical polishing apparatus 10, an index unit 11, a transfer robot 12, and a cleaning apparatus 13.

Figure 2:
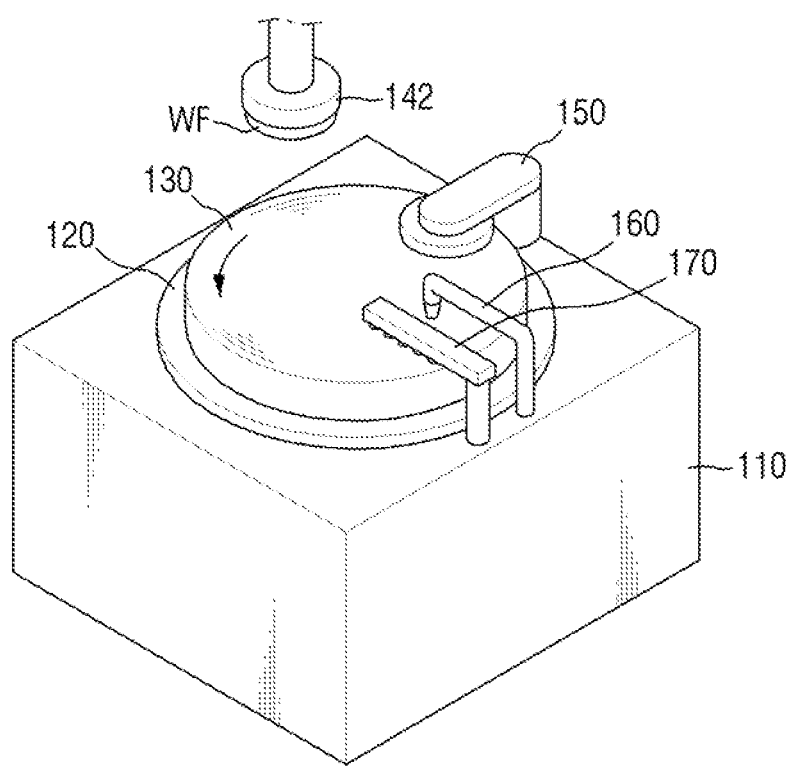
FIG. 2 is a schematic perspective view illustrating a chemical mechanical polishing apparatus according to some embodiments of the present disclosure.

The chemical mechanical polishing apparatus 10 may polish a wafer WF (see, FIG. 2). In some embodiments of the present disclosure, the chemical mechanical polishing apparatus 10 may include a lower base 110, a load cup 115, a platen 120, a polishing pad 130, a carrier head assembly 140, a pad conditioner 150, a slurry supply unit 160, and a purging compound supply unit 170. The chemical mechanical polishing apparatus 10 is described below in more detail in the description of FIGS. 2 to 4.

The index unit 11 may provide a space in which a cassette CS in which the wafers WF are accommodated is placed. The index unit 11 may carry the wafer WF out from the cassette CS and transfer the wafer WF to the transfer robot 12 or may carry the wafer WF on which the polishing process has been completed into the cassette CS.

The transfer robot 12 may be disposed between the chemical mechanical polishing apparatus 10 and the index unit 11. The transfer robot 12 may transfer the wafer WF between the chemical mechanical polishing apparatus 10 and the index unit 11. For example, the load cup 115 adjacent to the transfer robot 12 may be disposed in the chemical mechanical polishing apparatus 10. The load cup 115 may provide a space for the wafer WF to temporarily wait. In addition, an exchanger 117 may be disposed between the transfer robot 12 and the load cup 115. The exchanger 117 may transfer the wafer WF transferred from the index unit 11 by the transfer robot 12 to the load cup 115 or transfer the wafer WF disposed on the load cup 115 to the transfer robot 12.

The cleaning apparatus 13 may be disposed between the index unit 11 and the transfer robot 12. The wafer WF polished in the chemical mechanical polishing apparatus 10 may be disposed on the load cup 115. The wafer WF disposed on the load cup 115 may be transferred to the cleaning apparatus 13 by the transfer robot 12 disposed adjacent to the load cup 115. The cleaning apparatus 13 may clean contaminants remaining on the polished wafer WF. The cleaned wafer WF may be conveyed to the index unit 11 and stored in the cassette CS. Accordingly, the polishing process for the wafer WF may be completed.

Figure 3:
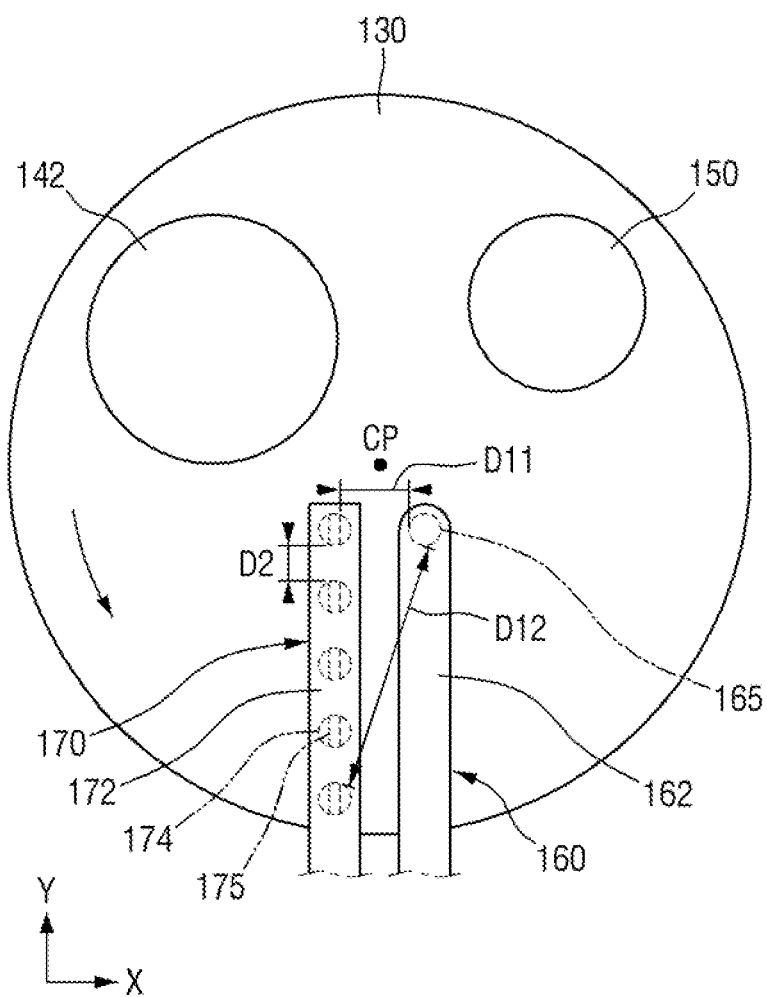
FIG. 3 is a schematic plan view illustrating a slurry supply unit and a purging compound supply unit of FIG. 2.
Figure 4:
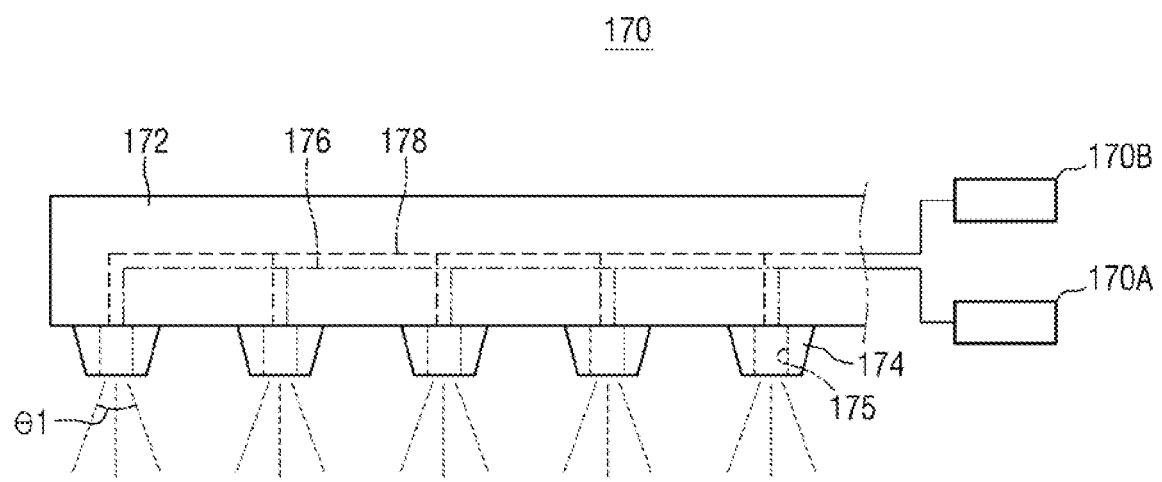
FIG. 4 is a schematic side view illustrating the purging compound supply unit of FIG. 2.

FIG. 2 is a schematic perspective view illustrating a chemical mechanical polishing apparatus according to some embodiments of the present disclosure. FIG. 3 is a schematic plan view illustrating a slurry supply unit and a purging compound supply unit of FIG. 2. FIG. 4 is a schematic side view illustrating the purging compound supply unit of FIG. 2.

Referring to FIGS. 1 to 4, a chemical mechanical polishing apparatus, according to some embodiments of the present disclosure, may include the lower base 110, the load cup 115, the platen 120, the polishing pad 130, the carrier head assembly 140, the pad conditioner 150, the slurry supply unit 160, and the purging compound supply unit 170.

The lower base 110 may provide a lower structure of a chemical mechanical polishing apparatus according to some embodiments of the present disclosure. For example, the lower base 110 may support the load cup 115, the platen 120, the polishing pad 130, the carrier head assembly 140, the pad conditioner 150, the slurry supply unit 160, and the purging compound supply unit 170, described below.

The platen 120 may be disposed on a top surface of the lower base 110. The platen 120 may be rotatable. For example, the platen 120 may rotate by receiving rotational power from a motor disposed within the lower base 110. For example, the platen 120 may rotate around a rotation axis that is perpendicular to the top surface of the platen 120.

In some embodiments of the present disclosure, a plurality of platens 120 may be provided on the lower base 110. For example, as illustrated in FIG. 1, the plurality of platens 120 may be spaced apart from each other at a predetermined interval based on the center of the lower base 110.

The polishing pad 130 may be disposed on the top surface of the platen 120. The polishing pad 130 may be supported by the platen 120 and may be rotatable. The polishing pad 130 may be provided as a plate having a predetermined thickness, for example, a circular plate, but the present invention is not necessarily limited thereto.

The polishing pad 130 may include a polishing surface having a predetermined degree of roughness. When the chemical mechanical polishing process is being performed, the polishing surface of the polishing pad 130 may be directly in contact with the wafer WF to mechanically polish the wafer WF. In some embodiments of the present disclosure, the polishing surface may be a top surface of the polishing pad 130.

Figure 5:
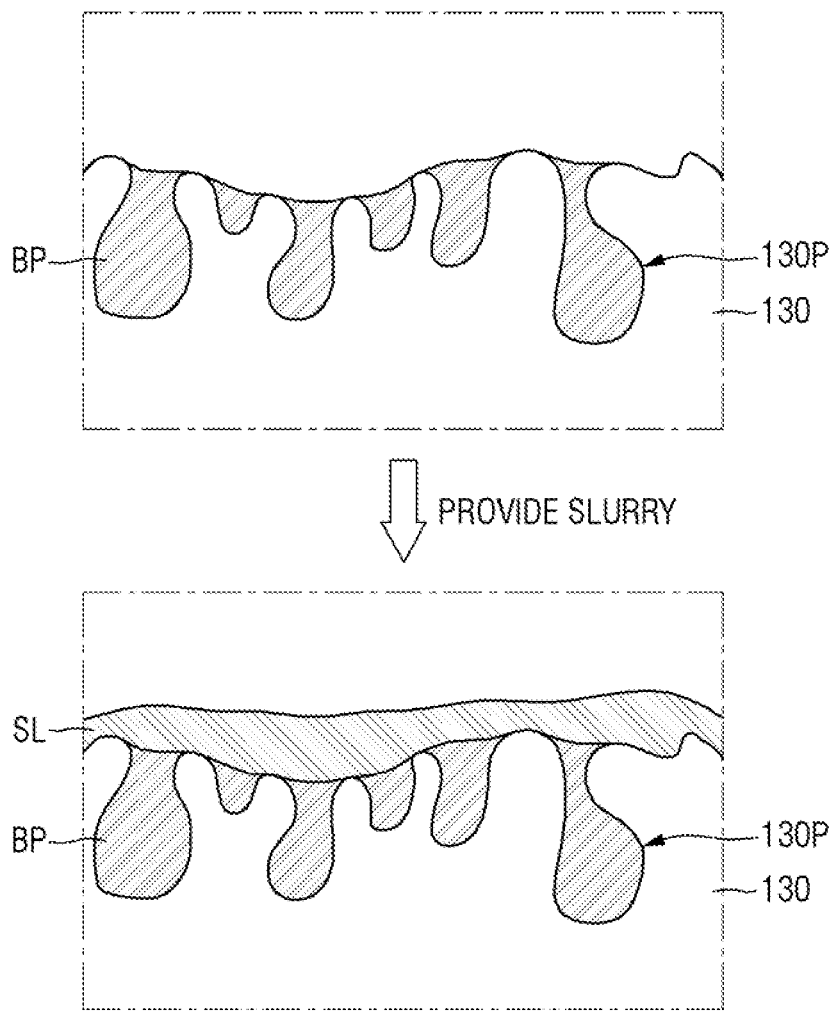
FIGS. 5 and 6 are diagrams illustrating an effect of a chemical mechanical polishing apparatus according to some embodiments of the present disclosure.

The polishing pad 130 may include a porous material having a plurality of microspaces (e.g., pores 130P of FIG. 5). The pores of the polishing pad 130 may accommodate a slurry (e.g., a first slurry and/or a second slurry as described below) provided when a chemical mechanical polishing process is being performed. The polishing pad 130 may include, for example, a polyurethane pad, but the present invention is not necessarily limited thereto.

In some embodiments of the present disclosure, the polishing pad 130 may be a conductor of electricity. The polishing pad 130, which is a conductor of electricity, may be grounded to prevent the occurrence of a short circuit. However, this is only exemplary, and the polishing pad 130 may be an insulator.

The carrier head assembly 140 may be disposed on the lower base 110. The carrier head assembly 140 may include a polishing head 142 and an upper base 144.

The polishing head 142 play bring the wafer WF to the polishing pad 130. For example, the polishing head 142 may dispose the wafer WF so that the polishing target surface of the wafer WF faces the polishing surface (top surface) of the polishing pad 130. The polishing head 142 may connect to the wafer WF by, for example, a vacuum adsorption method, but the present invention is not necessarily limited thereto.

When the chemical mechanical polishing process is being performed, the polishing head 142 may move in upward and downward directions to press the wafer WF on the polishing pad 130. For example, the polishing head 142 may press the wafer WF by being moved in upward and downward directions using a pneumatic or hydraulic cylinder. When the chemical mechanical polishing process is being performed, the polishing head 142 may rotate. For example, the polishing head 142 may rotate by receiving rotational power from a motor. For example, the polishing head 142 may rotate about a rotation axis that is perpendicular to the top surface of the polishing pad 130. Accordingly, the wafer WF may be polished by the polishing pad 130.

The polishing head 142 may be disposed on each of the platens 120 by the upper base 144. For example, as illustrated in FIG. 1, the upper base 144 may have a shape in which two bars cross each other (e.g., a cross (or X) shape). The polishing head 142 may be disposed on at least one end of each of the rods of the upper base 144. As the upper base 144 rotates, the polishing head 142 may sequentially move from the load cup 115 to each of the platens 120. As an example, the polishing head 142 may be moved to the platen 120 after loading the wafer WF from the load cup 115 to polish the wafer WF. In addition, the polishing head 142 may unload the polished wafer WF onto the load cup 115.

The pad conditioner 150 may be disposed adjacent to the polishing pad 130. The pad conditioner 150 may perform a conditioning process on the polishing pad 130. Accordingly, the pad conditioner 150 may stably maintain the state of the polishing surface (upper state) of the polishing pad 130 so that the wafer WF is effectively polished during the chemical mechanical polishing process.

The slurry supply unit 160 may be disposed adjacent to the polishing pad 130. When the chemical mechanical polishing process is being performed, the slurry supply unit 160 may supply a slurry onto the polishing pad 130.

For example, as illustrated in FIG. 3, the slurry supply unit 160 may include a first tube part 162 and a first injection hole 165. The first tube part 162 may extend along a direction (e.g., a first direction Y) from an edge of the polishing pad 130 toward a center point CP of the polishing pad 130. The first injection hole 165 may be disposed at one end of the first tube part 162 adjacent to the center point CP of the polishing pad 130. The slurry may be supplied onto the polishing pad 130 through the first tube part 162 and the first injection hole 165.

The slurry supplied from the slurry supply unit 160 may include, for example, a reactant (e.g., deionized water for oxidation polishing), abrasion particles (e.g., silicon dioxide for oxidation polishing), and a chemical reaction catalyst (e.g., potassium hydroxide for oxidation polishing), but the present invention is not necessarily limited thereto.

The purging compound supply unit 170 may be disposed adjacent to the polishing pad 130 and the slurry supply unit 160 and may be arranged substantially parallel to the slurry supply unit 160. When the chemical mechanical polishing process is being performed, the purging compound supply unit 170 may supply a purging compound onto the polishing pad 130.

For example, as illustrated in FIGS. 3 and 4, the purging compound supply unit 170 may include a second tube part 172 and a second injection hole 175. The second tube part 172 may extend along a direction (e.g., the first direction Y) from the edge of the polishing pad 130 toward the center point CP of the polishing pad 130.

In some embodiments of the present disclosure, the second tube part 172 of the purging compound supply unit 170 may extend parallel to the first tube part 162 of the slurry supply unit 160. The second injection hole 175 may communicate with the second tube part 172. For example, a nozzle 174 protruding from the second tube part 172 toward the polishing pad 130 may be formed. The second injection hole 175 may be formed in the nozzle 174. The purging compound may be supplied on the polishing pad 130 through the second tube part 172 and the second injection hole 175.

In some embodiments of the present disclosure, the purging compound supply unit 170 may include a plurality of second injection holes 175. For example, a plurality of nozzles 174 protruding from the second tube part 172 toward the polishing pad 130 may be formed. The second injection hole 175 may be formed in each of the nozzles 174.

In some embodiments of the present disclosure, the plurality of second injection holes 175 may be arranged along a direction (e.g., the first direction Y) in which the first tube part 162 extends. In some embodiments of the present disclosure, the plurality of second injection holes 175 may be spaced apart from each other by the same distance. For example, as illustrated in FIG. 3, a distance D2 at which the adjacent second injection holes 175 are spaced apart from each other among the plurality of second injection holes 175 may be the same. The term "same" as used herein not only covers the case in which the two values are completely identical but also includes a minute difference that may occur due to a process margin and the like. For example, the distances may all be within +/−2% of one another.

In some embodiments of the present disclosure, each of the second injection holes 175 may have a shape extending in a direction in which the first tube part 162 extends (e.g., the first direction Y). For example, in a plan view, each of the second injection holes 175 may include a long side extending in the first direction Y and a short side extending in a second direction X intersecting the first direction Y.

The purging compound supplied from the purging compound supply unit 170 may include a first purging compound and a second purging compound having different temperatures. For example, the purging compound supply unit 170 may supply a first purging compound having a first purging temperature or a second purging compound having a second purging temperature that is lower than the first purging temperature. For example, the temperature of the first purging compound supplied from the purging compound supply unit 170 may be higher than the temperature of the second purging compound supplied from the purging compound supply unit 170.

In some embodiments of the present disclosure, the first purging temperature of the first purging compound may be higher than room temperature. For example, the first purging temperature of the first purging compound may be about 25° C. to about 80° C.

In some embodiments of the present disclosure, the second purging temperature of the second purging compound may be lower than room temperature. For example, the second purging temperature of the second purging compound may be about −10° C. to about 25° C.

In some embodiments of the present disclosure, each of the first purging compound and the second purging compound may include an inert gas. For example, each of the first purging compound and the second purging compound may include nitrogen gas ($N_2$). In some embodiments of the present disclosure, the second purging compound may include a liquefied non-reactive gas. As an example, the second purging compound may include liquid nitrogen.

In some embodiments of the present disclosure, the purging compound supply unit 170 may supply at least one of the first purging compound or the second purging compound. For example, as illustrated in FIG. 4, the purging compound supply unit 170 may include a first pipe 176 and a second pipe 178 that are formed separately and do not communicate with one another. The first purging compound may be supplied from the purging compound supply unit 170 through the first pipe 176, and the second purging compound may be supplied from the purging compound supply unit 170 through the second pipe 178. In some embodiments of the present disclosure, the first purging compound and the second purging compound may be separately controlled and supplied from the purging compound supply unit 170.

In some embodiments of the present disclosure, the first pipe 176 may be connected to a heater 170A. The non-reactive gas (e.g., nitrogen gas) provided through the first pipe 176 may be heated by the heater 170A to be provided at the first purging temperature.

In some embodiments of the present disclosure, the second pipe 178 may be connected to a chiller 170B. The non-reactive gas (e.g., nitrogen gas) provided through the second pipe 178 may be cooled by the chiller 170B to be provided at the second purging temperature. In some embodiments of the present disclosure, the chiller 170B may include a liquefier. The non-reactive gas (e.g., nitrogen gas) provided through the second pipe 178 may be liquefied by the chiller 170B including a liquefier.

In some embodiments of the present disclosure, the second injection hole 175 of the purging compound supply unit 170 may be spaced apart from the first injection hole 165 of the slurry supply unit 160 by a predetermined distance. For example, the diameter of the polishing pad 130 may be about 30 inches (about 76.2 centimeters). In this case, each of the distances D11 and D12 at which the plurality of second injection holes 175 are separated from the first injection hole 165 of the slurry supply unit 160 may be about 20 cm or less. When the second injection hole 175 of the purging compound supply unit 170 is spaced apart further than the predetermined distance from the first injection hole 165 of the slurry supply unit 160, a chemical mechanical polishing apparatus, according to some embodiments of the present disclosure, might not efficiently control the polishing temperature. A detailed description thereof is provided with reference to FIGS. 5 to 8.

For example, among the plurality of second injection holes 175, the distance D11 at which the second injection hole 175 closest to the center point CP of the polishing pad 130 is spaced apart from the first injection hole 165 of the slurry supply unit 160 may be about 1 cm to about 5 cm. In addition, by way of example, among the plurality of second injection holes 175, the distance D12 at which the second injection hole 175 farthest from the center point CP of the polishing pad 130 is spaced apart from the first injection hole 165 of the slurry supply unit 160 may be about 15 cm or more and about 20 cm or less.

In some embodiments of the present disclosure, the second injection hole 175 of the purging compound supply unit 170 may supply the purging compound at a predetermined angle. For example, as illustrated in FIG. 4, each of the second injection holes 175 may supply the purging compound at a first disbursement angle θ1. The first disbursement angle θ1 may be, for example, 30°, 60°, 90°, or 120°, but the present invention is not necessarily limited thereto.

The plurality of second injection holes 175 are illustrated to supply the purging compound at the same disbursement angle (e.g., the first disbursement angle θ1), but this is only exemplary and the present invention is not necessarily limited thereto. For example, the disbursement angle of the second injection hole 175 may increase as the distance from the center point CP of the polishing pad 130 increases. For example, among the plurality of second injection holes 175, the second injection hole 175 closest to the center point CP of the polishing pad 130 may supply a purging compound at the disbursement angle of 30°, and among the plurality of second injection holes 175, the second injection hole 175 that is farthest from the center point CP of the polishing pad 130 may supply the purging compound at the disbursement angle of 120°. In this case, the purging compound supply unit 170 may supply the purging compound more evenly onto the polishing pad 130 provided as a circular plate.

The slurry supply unit 160 may supply the slurry after the purging compound supply unit 170 supplies at least one of the first purging compound or the second purging compound. For example, a point on the polishing pad 130 may pass through the slurry supply unit 160 after passing through the purging compound supply unit 170. For example, as illustrated in FIGS. 2 and 3, the polishing pad 130 may rotate in a counterclockwise direction. In addition, as illustrated in FIG. 3, the slurry supply unit 160 and the purging compound supply unit 170 may be disposed below the center point CP of the polishing pad 130. In this case, the purging compound supply unit 170 may be disposed on the left side of the slurry supply unit 160. Accordingly, the slurry supply unit 160 may supply the slurry onto the polishing pad 130 to which at least one of the first purging compound or the second purging compound is supplied.

In some embodiments of the present disclosure, the slurry supplied from the slurry supply unit 160 may include the first slurry and the second slurry having different temperatures. For example, the slurry supply unit 160 may supply the first slurry having a first slurry temperature or the second slurry having a second slurry temperature lower than the first slurry temperature. For example, the temperature of the first slurry supplied from the slurry supply unit 160 may be higher than the temperature of the second slurry supplied from the slurry supply unit 160.

In some embodiments of the present disclosure, the first slurry may increase a polishing rate in the chemical mechanical polishing process. For example, the first slurry at a relatively high temperature (e.g., the first slurry temperature) may increase chemical reactivity to increase a polishing rate for the wafer WF. The first slurry temperature may be the same as or different from the first purging temperature.

In some embodiments of the present disclosure, the second slurry may increase polishing flatness in the chemical mechanical polishing process. For example, the second slurry at a relatively low temperature (for example, the second slurry temperature) may reduce the chemical reactivity to reduce the polishing rate for the wafer WF, which may increase the polishing flatness for the wafer WF. The second slurry temperature may be the same as or different from the second purging temperature.

In some embodiments of the present disclosure, the first slurry temperature of the first slurry may be higher than room temperature. For example, the first slurry temperature of the first slurry may be from about 25° C. to about 90° C.

In some embodiments of the present disclosure, the second slurry temperature of the second slurry may be lower than room temperature. For example, the second slurry temperature of the second slurry may be from about −10° C. to about 25° C.

In some embodiments of the present disclosure, the slurry supply unit 160 may supply at least one of the first slurry or the second slurry. In some embodiments of the present disclosure, the first slurry and the second slurry may be separately controlled and supplied from the slurry supply unit 160.

In some embodiments of the present disclosure, the slurry supply unit 160 may supply the first slurry when the purging compound supply unit 170 supplies the first purging compound. Accordingly, the slurry supply unit 160 may supply the first slurry onto the polishing pad 130 supplied with the first purging compound.

In some embodiments of the present disclosure, the slurry supply unit 160 may supply the second slurry when the purging compound supply unit 170 supplies the second purging compound. Accordingly, the slurry supply unit 160 may supply the second slurry onto the polishing pad 130 supplied with the second purging compound.

Figure 6:
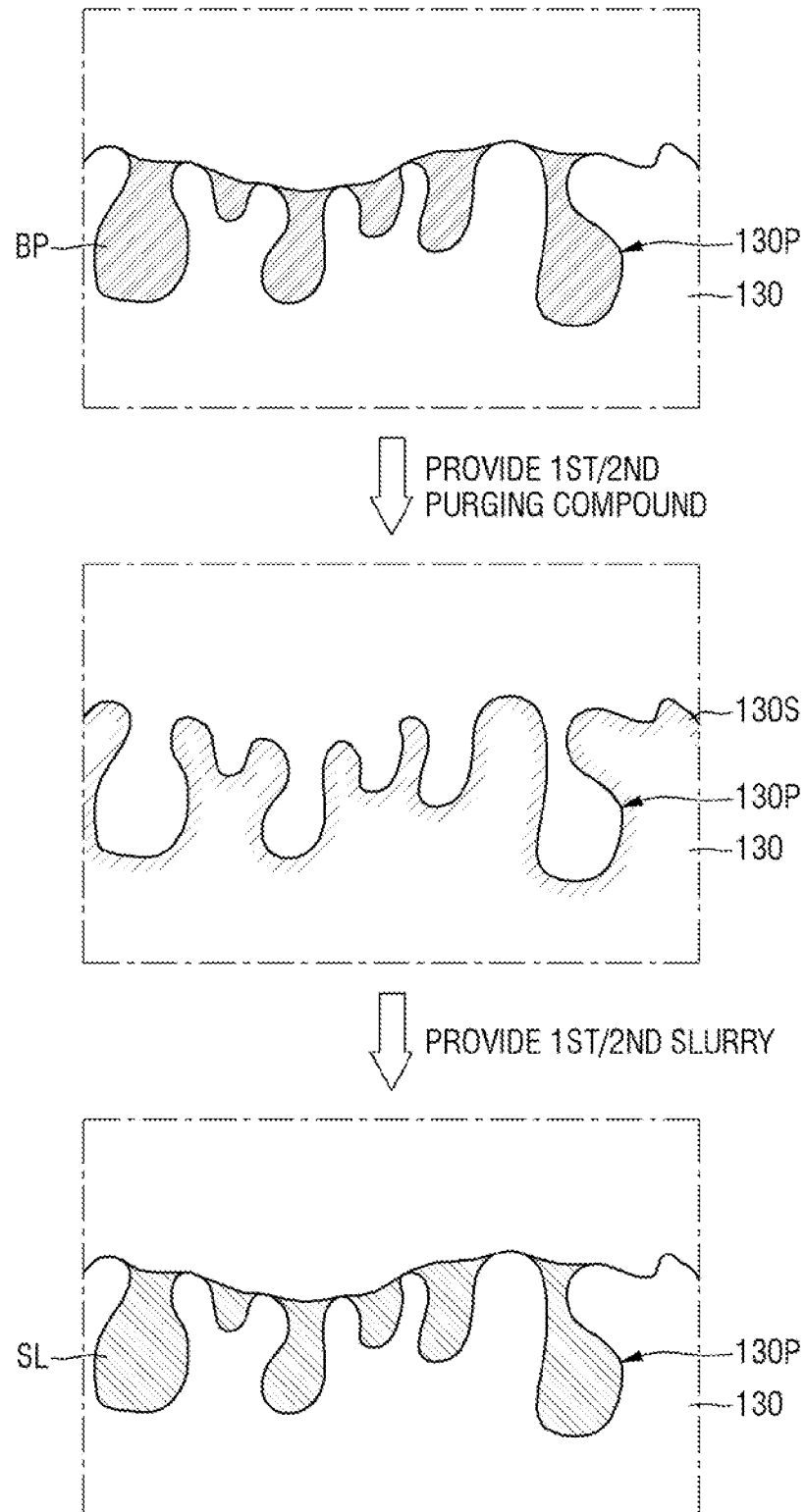

FIGS. 5 and 6 are diagrams illustrating the effect of a chemical mechanical polishing apparatus according to some embodiments of the present disclosure. For reference, FIGS. 5 and 6 illustrate a portion of a cross section of the polishing pad 130 described above with reference to FIGS. 1 to 4.

Referring to 1 to 5, the polishing pad 130 may include a plurality of pores 130P. The pores 130P of the polishing pad 130 may receive a slurry SL provided from the slurry supply unit 160. However, when the chemical mechanical polishing process is performed, a by-product BP may exist in the pores 130P. The by-product BP may be, for example, a material separated from the wafer WF when the chemical mechanical polishing process is being performed, or a slurry remaining in the pore 130P before a new slurry is provided.

In this case, when the slurry SL is provided on the polishing pad 130 from the slurry supply unit 160, the slurry SL might not efficiently fill the pores 130P due to the by-product BP existing in the pores 130P. This is not only a cause of lowering the efficiency of the chemical mechanical polishing process, but also a cause of reducing the contact area between the slurry SL and the polishing pad 130, thereby making it difficult to efficiently control the polishing temperature of the chemical mechanical polishing process.

For example, to increase the polishing rate of the chemical mechanical polishing process, the first slurry having a relatively high temperature (e.g., the first slurry temperature) may be used as the slurry SL. However, since the first slurry might not efficiently fill the pores 130P due to the by-product BP existing in the pores 130P, the temperature of the polishing pad 130 might not be immediately increased.

Alternatively, as an example, to increase the polishing flatness of the chemical mechanical polishing process, the second slurry having a relatively low temperature (e.g., the second slurry temperature) may be used as the slurry SL. However, since the second slurry might not efficiently fill the pores 130P due to the by-product BP existing in the pores 130P, the temperature of the polishing pad 130 might not be immediately decreased.

However, referring to FIGS. 1 to 4 and 6, the chemical mechanical polishing apparatus according to some embodiments of the present disclosure may include the purging compound supply unit 170 to more easily control a polishing temperature.

For example, before the slurry SL is provided from the slurry supply unit 160 to the polishing pad 130, a purging compound (for example, the first purging compound or the second purging compound) from the purging compound supply unit 170 may be provided on the polishing pad 130. The purging compound provided from the purging compound supply unit 170 may remove the by-product BP existing in the pores 130P. Subsequently, when the slurry SL is provided on the polishing pad 130 from the slurry supply unit 160, the slurry SL may efficiently fill the pores 130P. Accordingly, the efficiency of the chemical mechanical polishing process may be increased.

The purging compound supply unit 170 may supply the first purging compound and/or the second purging compound at a predetermined pressure. The predetermined pressure may be a pressure required to remove the by-product BP existing in the pores 130P of the polishing pad 130. For example, the purging compound supply unit 170 may supply the purging compound at a flow rate of about 100 LPM (liter per minute) to about 150 LPM.

In addition, a chemical mechanical polishing apparatus, according to some embodiments of the present disclosure, may more easily control the polishing temperature. For example, the purging compound provided from the purging compound supply unit 170 may control the temperature of a surface 130S of the pore 130P while removing the by-product BP existing in the pores 130P.

For example, to increase the polishing rate of the chemical mechanical polishing process, the first purging compound having a relatively high temperature (e.g., the first purging temperature) may be used as a purging compound. The first purging compound may increase the temperature of the surface 130S of the pore 130P while removing the by-product BP existing in the pores 130P. Subsequently, the first slurry at the first slurry temperature may be provided on the polishing pad 130 from the slurry supply unit 160. Accordingly, the first slurry may quickly or immediately increase the temperature of the polishing pad 130.

In addition, as an example, to increase the polishing flatness of the chemical mechanical polishing process, the second purging compound having a relatively low temperature (e.g., the second purging temperature) may be used as a purging compound. The second purging compound may lower the temperature of the surface 130S of the pore 130P while removing the by-product BP existing in the pores 130P. Subsequently, the second slurry at the second slurry temperature may be provided on the polishing pad 130 from the slurry supply unit 160. Accordingly, the second slurry may quickly or immediately lower the temperature of the polishing pad 130.

Figure 7:
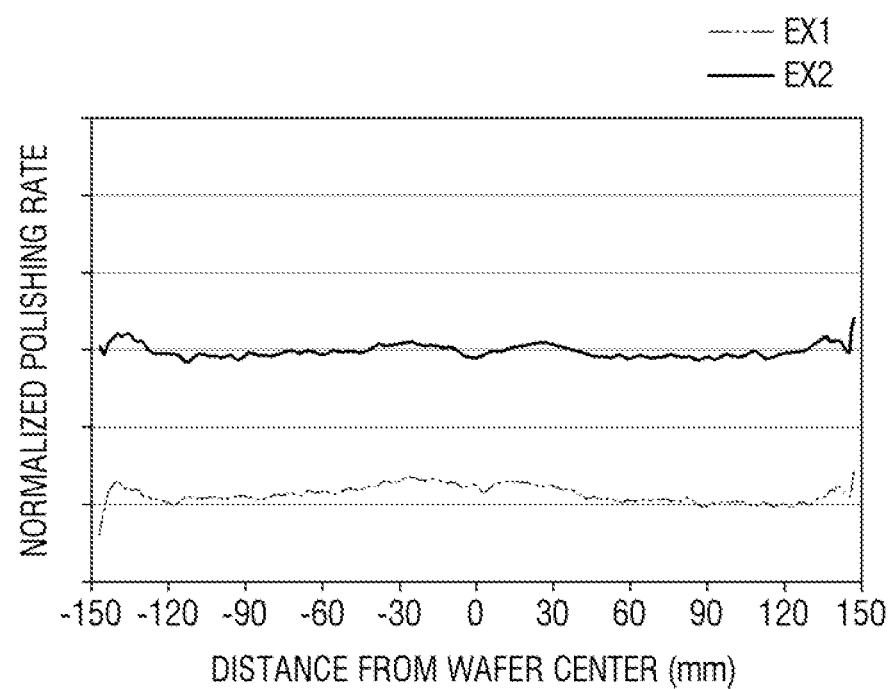
FIGS. 7 and 8 are graphs illustrating an effect of a chemical mechanical polishing apparatus according to some embodiments of the present disclosure.
Figure 8:
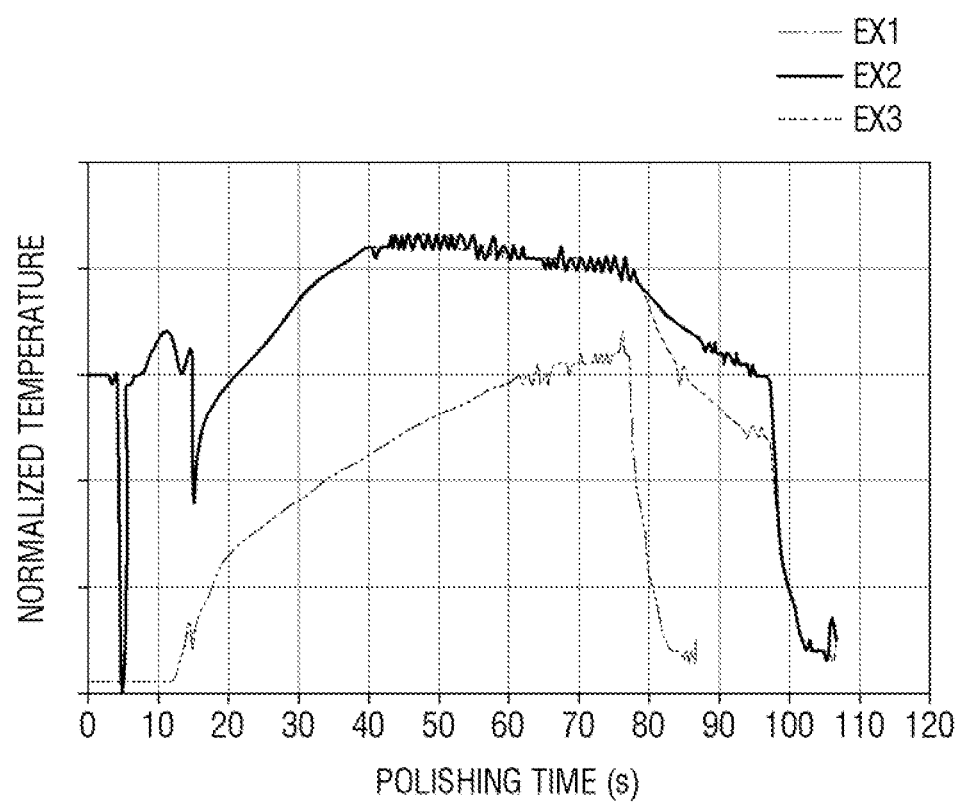

FIGS. 7 and 8 are graphs illustrating the effect of a chemical mechanical polishing apparatus according to some embodiments of the present disclosure.

In the graph of FIG. 7, the x-axis represents a distance separated from the center point of the wafer WF, and the y-axis represents a normalized polishing rare for the wafer WF.

In addition, in the graph of FIG. 7, Experimental Example 1 (EX1) represents a case of using a slurry at room temperature (25° C.), and Experimental Example 2 (EX2) represents a case of using a slurry at a relatively high temperature (50° C.).

Referring to FIG. 7, it may be seen that in the case of Experimental Example 2 (EX2), the overall polishing rate of the wafer WF is higher than that of Experimental Example 1 (EX1). Accordingly, it may be seen that the relatively high temperature slurry (for example, the first slurry) increases the polishing rate for the wafer WF.

In the graph of FIG. 8, the x-axis represents polishing time, and the y-axis represents the normalized temperature of the polishing pad 130.

In addition, in the graph of FIG. 8, Experimental Example 1 (EX1) represents the case that uses a slurry at room temperature (25° C.) at the first half of polishing (0 seconds to about 80 seconds) and that uses a slurry at a relatively low temperature (20° C.) at the second half of polishing (about 80 seconds to about 110 seconds). Experimental Example 2 (EX2) represents the case that uses a slurry at a relatively high temperature (50° C.) at the first half of polishing (0 seconds to about 80 seconds) and that uses a slurry at a relatively low temperature (20° C.) at the second half of polishing (about 80 seconds to about 110 seconds). Experimental Example 3 (EX3) represents the case that uses a slurry at a relatively high temperature (50° C.) at the first half of polishing (0 seconds to about 80 seconds) and that uses both of a slurry at a relatively low temperature (20° C.) and a purging compound at a relatively low temperature (20° C.) at the second half of polishing (about 80 seconds to about 110 seconds).

Referring to FIG. 8, it may be seen that in the case of Experimental Example 2 (EX2) and Experimental Example 3 (EX3), the polishing pad 130 exhibits a higher polishing temperature during the overall polishing time, compared to Experimental Example 1 (EX1). Accordingly, it may be seen that the relatively high temperature slurry (for example, the first slurry) increases the polishing rate for the wafer WF.

In addition, referring to FIG. 8, it may be seen that in the case of Experimental Example 3 (EX3) a higher temperature drop rate is exhibited compared to Experimental Example 2 (EX2). For example, it may be seen that during the first half of polishing (0 seconds to about 80 seconds), the temperature of the polishing pad 130 increases as the polishing time increases and then tends to converge to a specific temperature. However, it may be seen that during the second half of polishing (about 80 seconds to about 110 seconds) in which a slurry at a relatively low temperature (20° C.) is supplied, the temperature of the polishing pad 130 is lowered in both of Experimental Example 2 (EX2) and Experimental Example 3 (EX3). At this time, in the case of Experimental Example 2 (EX2) in which a slurry at a relatively low temperature (20° C.) (for example, the second slurry) is only used, the temperature drop rate of about 0.5° C./s may be exhibited, and on the other hand, in the case of Experimental Example 3 (EX3) in which a slurry at a relatively low temperature (20° C.) (for example, the second slurry) and a purging compound at a relatively low temperature (20° C.) (for example, the second purging compound) are used together, the temperature drop rate of about 0.8° C./s may be exhibited. Accordingly, it may be seen that when the purging compound is used together with the slurry, the polishing temperature is more efficiently controlled.

Figure 9:
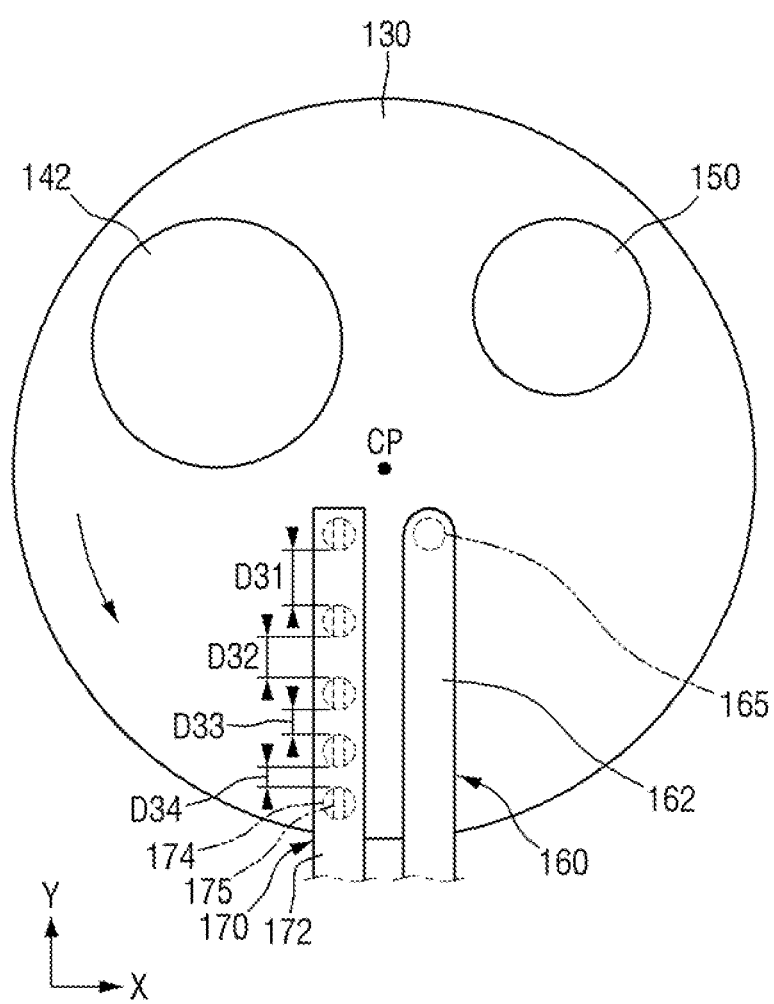
FIGS. 9 to 11 are various schematic plan views illustrating a slurry supply unit and a purging compound supply unit of a chemical mechanical polishing apparatus according to some embodiments of the present disclosure.
Figure 10:
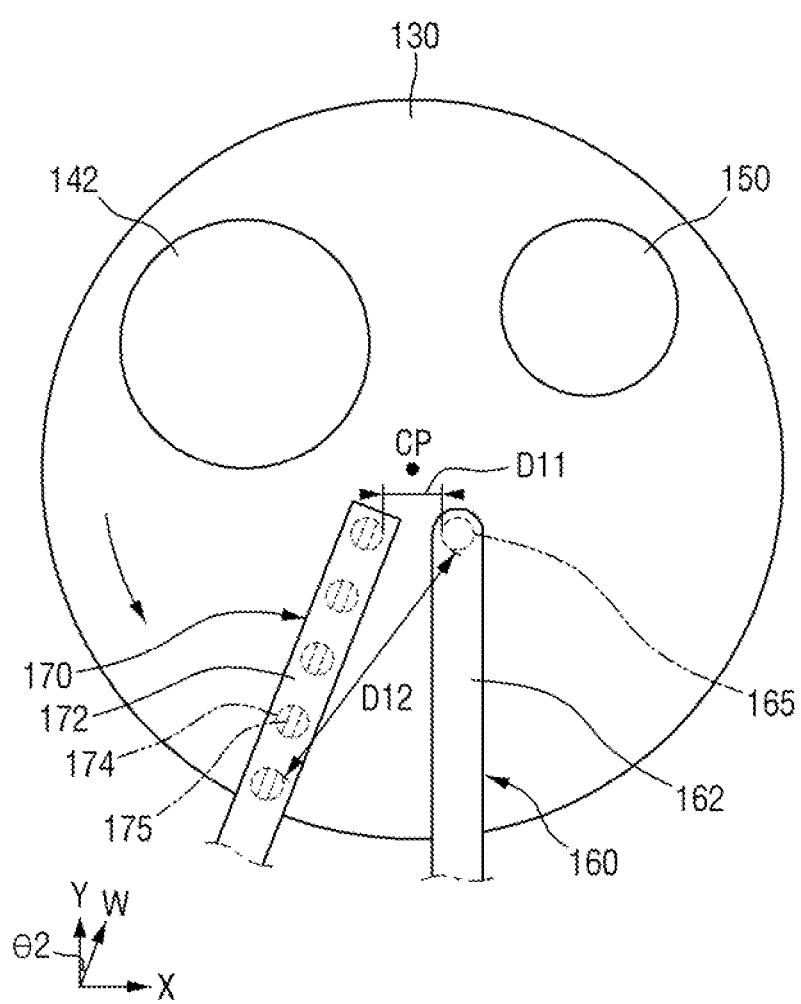
Figure 11:
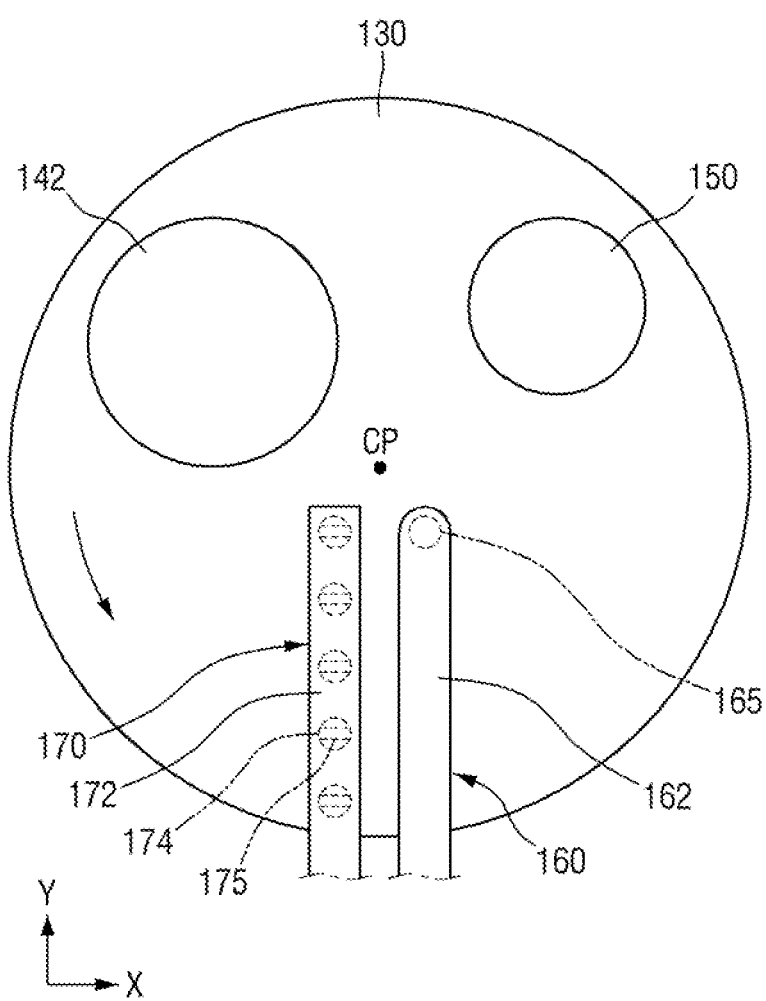

FIGS. 9 to 11 are various schematic plan views illustrating a slurry supply unit and a purging compound supply unit of a chemical mechanical polishing apparatus according to some embodiments of the present disclosure. To the extent that some illustrated elements are not described in detail, it may be assumed that these elements are at least similar to corresponding elements that are described elsewhere in the specification.

Referring to FIG. 9, in a chemical mechanical polishing apparatus, according to some embodiments of the present disclosure, distances D31, D32, D33, and D34 at which the adjacent second injection holes 175 are separated from each other among the plurality of second injection holes 175 may decrease as moving away from the center point CF of the polishing pad 130.

For example, the distance D31, at which the second injection hole 175 closest to the center point CP of the polishing pad 130 among the plurality of second injection holes 175 and the second injection hole 175 adjacent thereto are spaced apart, may be greater than the distance D34, at which the second injection hole 175 farthest from the center point CP of the polishing pad 130 among the plurality of second injection holes 175 and the second injection hole 175 adjacent thereto are spaced apart. In this case, the purging compound supply unit 170 may supply the purging compound more evenly onto the polishing pad 130 provided as a circular plate.

Referring to FIG. 10, in a chemical mechanical polishing, apparatus according to some embodiments of the present disclosure, the purging compound supply unit 170 may form a predetermined angle with the slurry supply unit 160.

For example, the second tube part 172 of the purging compound supply unit 170 may extend along the first direction Y and a direction (e.g., a third direction W) different from the second direction X, from the edge of the polishing pad 130 toward the center point CP of the polishing pad 130. Accordingly, the second tube part 172 of the purging compound supply unit 170 may form a second angle θ2 with the first tube part 162 of the slurry supply unit 160. The second angle θ2 may be, for example, 10° to 45°, but the present invention is not necessarily limited thereto.

Referring to FIG. 11, in a chemical mechanical polishing apparatus according to some embodiments of the present disclosure, each of the second injection holes 175 may have a shape extending in a direction (e.g., the second direction X) crossing the direction (for example, the first direction Y) in which the first tube part 162 extends.

For example, in a plan view, each of the second injection holes 175 may include a long side extending in the second direction X and a short side extending in the first direction Y.

Figure 12:
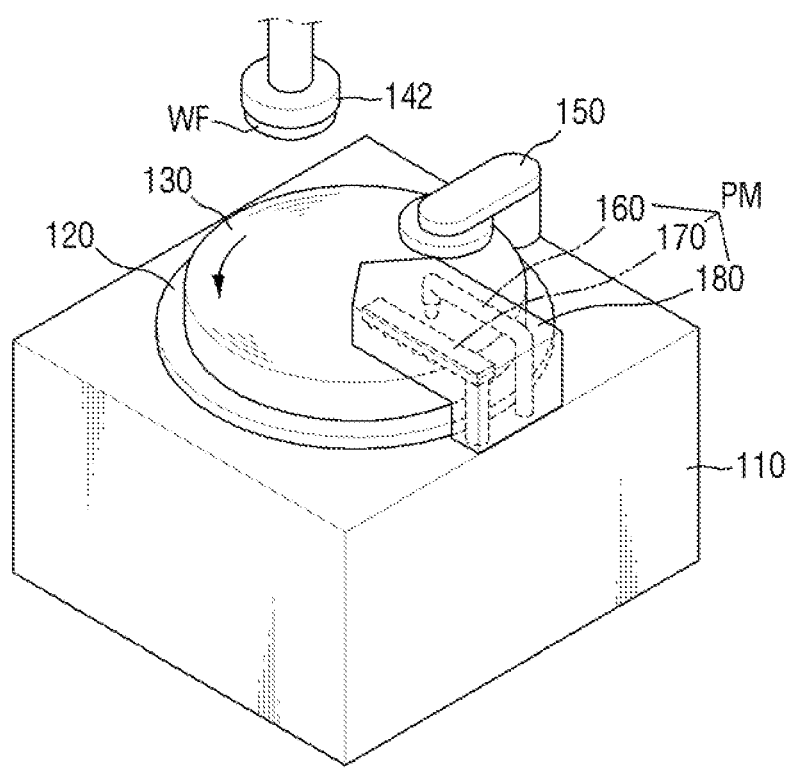
FIG. 12 is a schematic perspective view illustrating a slurry supply unit and a purging compound supply unit of a chemical mechanical polishing apparatus according to some embodiments of the present disclosure.

FIG. 12 is a schematic perspective view illustrating a slurry supply unit and a purging compound supply unit of a chemical mechanical polishing apparatus according to some embodiments of the present disclosure. To the extent that some illustrated elements are not described in detail, it may be assumed that these elements are at least similar to corresponding elements that are described elsewhere in the specification.

Referring to FIG. 12, a chemical mechanical polishing apparatus, according to some embodiments of the present disclosure, may further include a cover unit 180.

The cover unit 180 may cover the slurry supply unit 160 and the purging compound supply unit 170. The slurry supply unit 160 and the purging compound supply unit 170 may be protected by the cover unit 180. In some embodiments of the present disclosure, the slurry supply unit 160, the purging compound supply unit 170, and the cover unit 180 may form one supply module PM disposed adjacent to the polishing pad 130.

Hereinafter, a chemical mechanical polishing method and a method for fabricating a semiconductor device according to exemplary embodiments of the present disclosure is described with reference to FIGS. 1 to 19.

Figure 13:
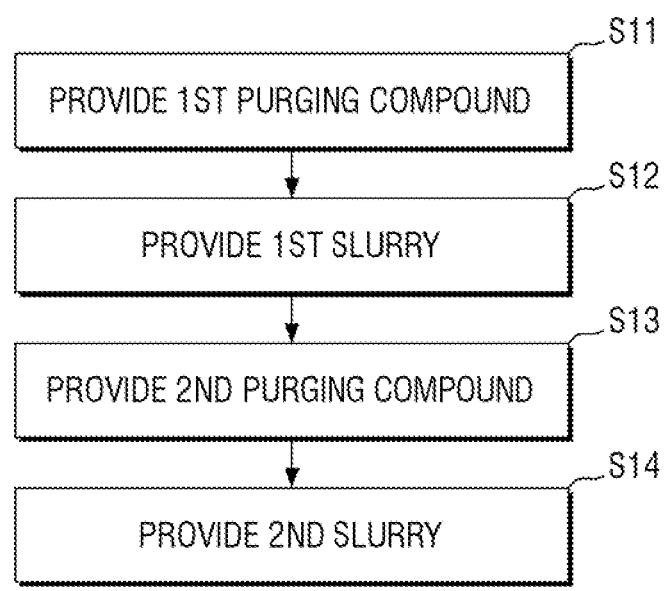
FIG. 13 is a flowchart illustrating a chemical mechanical polishing method according to some embodiments of the present disclosure.

FIG. 13 is a flowchart illustrating a chemical mechanical polishing method according to some embodiments of the present disclosure. To the extent that some illustrated elements are not described in detail, it may be assumed that these elements are at least similar to corresponding elements that are described elsewhere in the specification.

Referring to FIG. 13, a chemical mechanical polishing method according to some embodiments of the present disclosure may include supplying the first purging compound (step S11), supplying the first slurry (step S12), supplying the second purging compound (step S13), and supplying the second slurry (step S14).

The step S11 of supplying the first purging compound may be performed by, for example, the purging compound supply unit 170 described above with reference to FIGS. 1 to 8. For example, the polishing pad 130 described above with reference to FIGS. 1 to 8 may be provided. The purging compound supply unit 170 may supply the first purging compound having the first purging temperature on the polishing pad 130.

In some embodiments of the present disclosure, the first purging temperature of the first purging compound may be higher than room temperature. For example, the first purging temperature of the first purging compound may be about 25° C. to about 80° C.

The step S12 of supplying the first slurry may be performed by the slurry supply unit 160 described above with reference to FIGS. 1 to 8, for example. In some embodiments of the present disclosure, the slurry supply unit 160 may supply the first slurry having the first slurry temperature on the polishing pad 130. The first slurry may be supplied on the polishing pad 130 provided with the first purging compound having a relatively high temperature (e.g., the first purging temperature). Accordingly, the first slurry having a relatively high temperature (for example, the first slurry temperature) may quickly or immediately increase the temperature of the polishing pad 130.

In some embodiments of the present disclosure, the first slurry temperature of the first slurry may be higher than room temperature. For example, the first slurry temperature of the first slurry may be from about 25° C. to about 90° C.

The step S13 of supplying the second purging compound may be performed by, for example, the purging compound supply unit 170 described above with reference to FIGS. 1 to 8. For example, the polishing pad 130 described above with reference to FIGS. 1 to 8 may be provided. The purging compound supply unit 170 may supply the second purging compound having a second purging temperature on the polishing pad 130.

In some embodiments of the present disclosure, the second purging temperature of the second purging compound may be lower than room temperature. For example, the second purging temperature of the second purging compound may be about −10° C. to about 25° C.

The step S11 of supplying the second slurry may be performed by the slurry supply unit 160 described above with reference to FIGS. 1 to 8, for example. In some embodiments of the present disclosure, the slurry supply unit 160 may supply the second slurry having the second slurry temperature on the polishing pad 130. The second slurry may be supplied on the polishing pad 130 provided with the second purging compound having a relatively low temperature (e.g., the second purging temperature). Accordingly, the second slurry having a relatively low temperature (for example, the second slurry temperature) may quickly or immediately lower the temperature of the polishing pad 130.

In some embodiments of the present disclosure, the second slurry temperature of the second slurry may be lower than room temperature. For example, the second slurry temperature of the second slurry may be from about −10° C. to about 25° C.

In some embodiments of the present disclosure, the steps S13 and S14 of supplying the second purging compound and the second slurry may be performed after the steps S11 and S12 of supplying the first purging compound and the first slurry. For example, in a chemical mechanical polishing method according to some embodiments of the present disclosure, the first purging compound and the first slurry may be supplied (steps S11 and S12) at the first half of polishing, and the second purging compound and the second slurry may be supplied (steps S13 and S14) at the second half of polishing.

Figure 14:
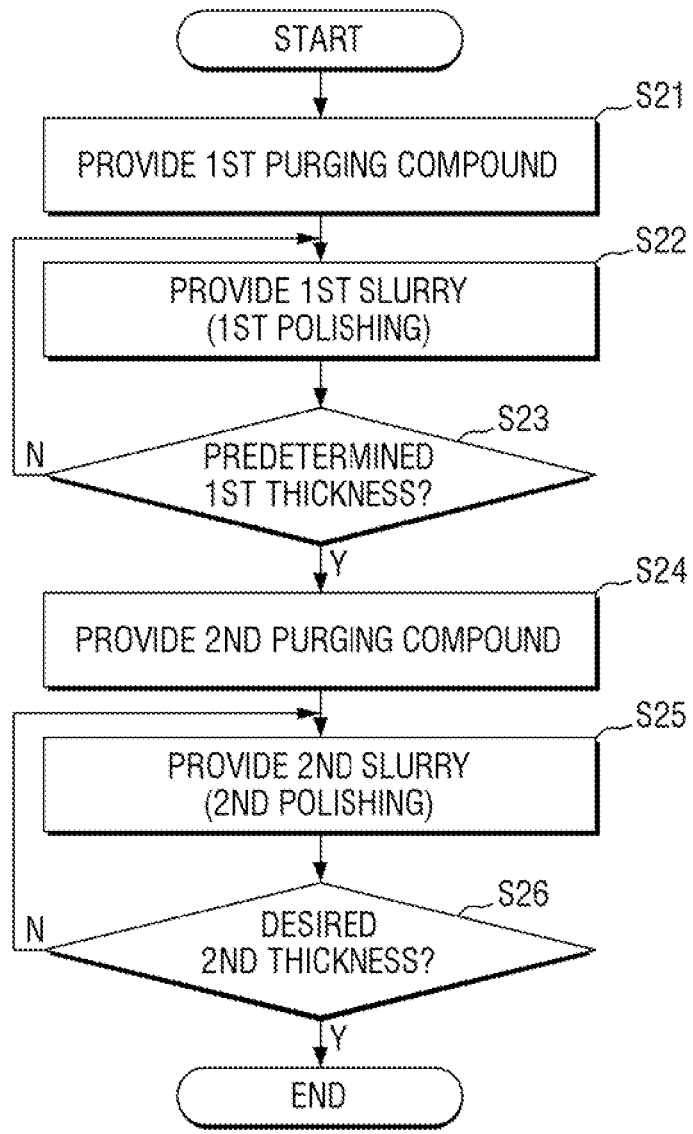
FIG. 14 is a flowchart illustrating a chemical mechanical polishing method according to some embodiments of the present disclosure.

FIG. 14 is a flowchart illustrating a chemical mechanical polishing method according to some embodiments of the present disclosure. FIGS. 15 to 18 are views illustrating the intermediate steps of a method for fabricating a semiconductor device according to some embodiments of the present disclosure. To the extent that some illustrated elements are not described in detail, it may be assumed that these elements are at least similar to corresponding elements that are described elsewhere in the specification.

Figure 15:
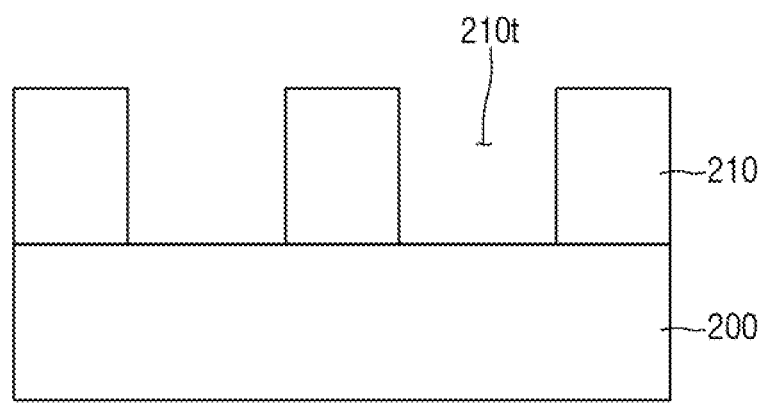
FIGS. 15 to 18 are views illustrating the intermediate steps of a method for fabricating a semiconductor device according to some embodiments of the present disclosure.

Referring to FIG. 15, a material pattern 210 is formed on a substrate 200.

The substrate 200 may be, for example, a bulk silicon or silicon-on-insulator (SOI) substrate. Alternatively, the substrate 200 may be a silicon substrate, or may include other materials such as silicon germanium, indium antimonide, lead tellurium compound, indium arsenide, indium phosphide, gallium arsenide, or gallium antimonide. Alternatively, the substrate 200 may have an epitaxial layer formed on a base substrate. For example, hereinafter, it is assumed that the substrate 200 is a silicon substrate.

The material pattern 210 may be formed on the substrate 200. The material pattern 210 may include a plurality of trenches 210t. For example, the material pattern 210 may form a plurality of isolated areas spaced apart by the trenches 210t. For example, it is described below that the material pattern 210 is an insulating pattern.

Figure 16:
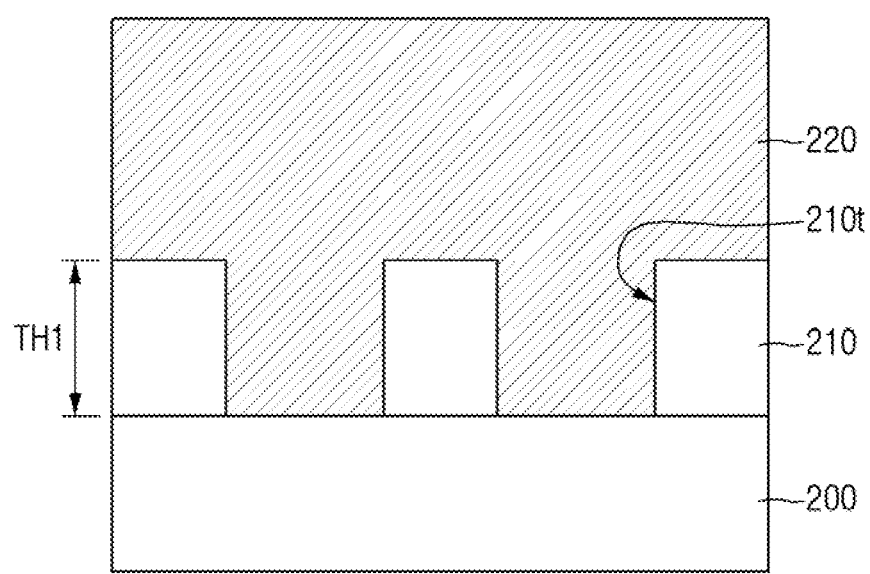

Referring to FIG. 16, a target layer 220 is formed on the substrate 200 and the material pattern 210.

The target layer 220 may fill the trenches 210t of the material pattern 210. For example, the thickness of the target layer 220 may be larger than a thickness TH1 of the material pattern 210. The target layer 220 may be a polishing target layer of a chemical mechanical polishing method according to some embodiments of the present disclosure. For example, it is described below that the target layer 220 is a conductive layer.

Figure 17:
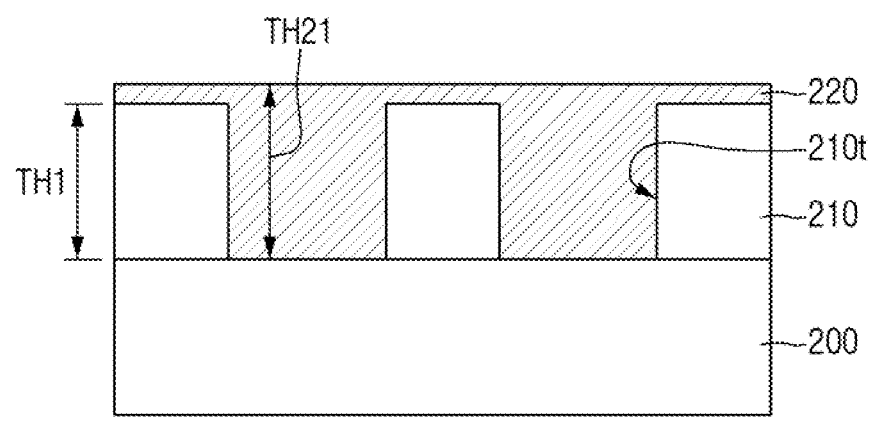

Referring to FIGS. 14 and 17, a first polishing process is performed on the target layer 220.

The first polishing process may use the first purging compound and the first slurry. For example, the first polishing process may include supplying the first purging compound and the first slurry (steps S21 and S22). The supplying of the first purging compound and the first slurry (steps S21 and S22) is similar to that described above with reference to FIG. 13, and thus to the extent that some illustrated elements are not described in detail, it may be assumed that these elements are at least similar to corresponding elements that are described elsewhere in the specification.

The first purging compound having a relatively high temperature (for example, the first purging temperature) and the first slurry having a relatively high temperature (for example, the first slurry temperature) may increase chemical reactivity to increase the polishing rate for the target layer 220. Accordingly, the first polishing process may increase productivity of a chemical mechanical polishing method according to some embodiments of the present disclosure.

In some embodiments of the present disclosure, the first polishing process may be performed until the target layer 220 reaches a predetermined first thickness (step S23). For example, after the first polishing process is performed, the target layer 220 may have a first thickness TH21. In some embodiments of the present disclosure, the first thickness TH21 of the target layer 220 may be greater than or equal to the thickness TH1 of the material pattern 210. For example, the first thickness TH21 of the target layer 220 may be about 100% to about 110% of the thickness TH1 of the material pattern 210.

Figure 18:
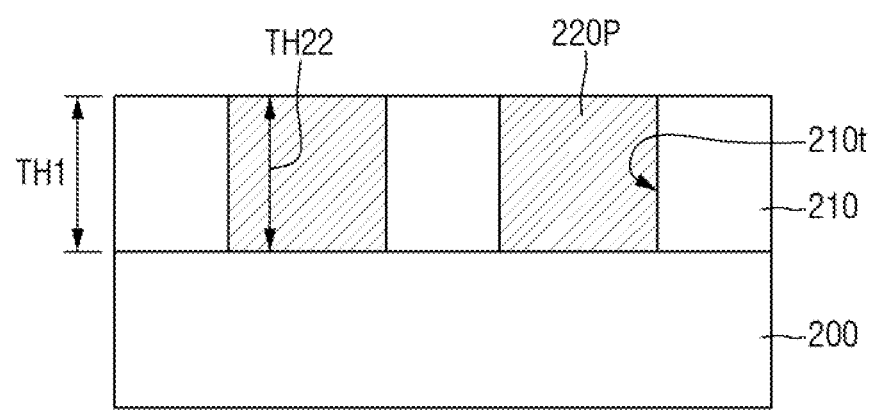

Referring to FIGS. 14 and 18, a second polishing process is performed on the target layer 220.

The second polishing process may use the second purging compound and the second slurry. For example, the second polishing process may include the supplying the second purging compound and the second slurry (steps S24 and S25). The supplying of the second purging compound and the second slurry (steps S24 and S25) is similar to that described above with reference to FIG. 13, and thus to the extent that some illustrated elements are not described in detail, it may be assumed that these elements are at least similar to corresponding elements that are described elsewhere in the specification.

The second purging compound having a relatively low temperature (for example, the second purging temperature) and the second slurry having a relatively low temperature (for example, the second slurry temperature) may reduce the polishing rate to increase the polishing flatness for the target layer 220. Accordingly, the second polishing process may increase performance of a chemical mechanical polishing method according to some embodiments of the present disclosure.

In some embodiments of the present disclosure, the second polishing process may be performed until the target layer 220 reaches a required second thickness (step S26). For example, after the second polishing process is performed, the target layer 220 may have a second thickness TH22. In some embodiments of the present disclosure, the second polishing process may be performed until the material pattern 210 is exposed. For example, in the second polishing process, the material pattern 210 may be used as an etch stop layer. The second thickness TH22 of the target layer 220 may be smaller than or equal to the thickness TH1 of the material pattern 210. Accordingly, a plurality of target patterns 220P spaced apart by the material pattern 210 may be formed.

In some embodiments of the present disclosure, each of the first polishing process and the second polishing process may be performed for a predetermined time. For example, the first polishing process may be performed with 50% of the total polishing time (for example, the sum of the time during which the first polishing process is performed and the time during which the second polishing process is performed), and the second polishing process may be performed with another 50% of the total polishing time.

In some embodiments of the present disclosure, a first time during which the first polishing process is performed may be greater than a second time during which the second polishing process is performed. For example, a ratio of the first time to the total polishing time (the sum of the first time and the second time) may be about 70% to about 95%. For example, a ratio of the first time to the sum of the first time and the second time may be 90%, and the ratio of the second time to the sum of the first time and the second time may be 10%.

FIG. 19 is a flowchart illustrating a chemical mechanical polishing method according to some embodiments of the present disclosure. To the extent that some illustrated elements are not described in detail, it may be assumed that these elements are at least similar to corresponding elements that are described elsewhere in the specification.

Referring to FIGS. 17 and 19, the first polishing process is performed on the target layer 220.

The first polishing process may use the first purging compound and the first slurry. For example, the first polishing process may include supplying the first purging compound and the first slurry (steps S31 and S32). The supplying of the first purging compound and the first slurry (steps S31 and S32) is similar to that described above with reference to FIG. 13, and thus to the extent that some illustrated elements are not described in detail, it may be assumed that these elements are at least similar to corresponding elements that are described elsewhere in the specification.

In some embodiments of the present disclosure, the first polishing process may be performed until a predetermined temperature is reached (step S33). The predetermined temperature may be a temperature required to achieve a required polishing rate. In some embodiments of the present disclosure, the predetermined temperature may be higher than room temperature. For example, the predetermined temperature may be in the range of about 25° C. to about 80° C.

Referring to FIGS. 18 and 19, the second polishing process is performed on the target layer 220.

The second polishing process may use the second purging compound and the second slurry. In some embodiments of the present disclosure, the second polishing process may include maintaining the predetermined temperature (step S34).

For example, to maintain the predetermined temperature, the polishing process using the second purging compound at a relatively low temperature (e.g., the second purging temperature) and the second slurry at a relatively low temperature (e.g., the second slurry temperature), may be performed.

Alternatively, for example, to maintain the predetermined temperature, the polishing process using the second purging compound at a relatively low temperature and the second slurry at a relatively low temperature and the polishing process using the first purging compound at a relatively high temperature and the first slurry at a relatively high temperature, may be repeatedly performed.

In some embodiments of the present disclosure, the second polishing process may be performed until the target layer 220 reaches a required thickness (step S35). In some embodiments of the present disclosure, the second polishing process may be performed until the material pattern 210 is exposed. For example, in the second polishing process, the material pattern 210 may be used as an etch stop layer. Accordingly, a plurality of target patterns 220P spaced apart by the material pattern 210 may be formed.

In some embodiments of the present disclosure, each of the first polishing process and the second polishing process may be performed for a predetermined time. In some embodiments of the present disclosure, a first time during which the first polishing process is performed may be greater than a second time during which the second polishing process is performed.

In concluding the detailed description, those skilled in the art will appreciate that many variations and modifications may be made to the embodiments set forth herein without substantially departing from the principles of the present disclosure.

What is claimed is:

1. A method for chemical mechanical polishing, comprising;
   providing a polishing pad;
   supplying a first purging compound having a first temperature onto the polishing pad;
   supplying a first slurry having a third temperature onto the polishing pad supplied with the first purging compound;
   supplying a second purging compound having a second temperature lower than the first temperature onto the polishing pad; and
   supplying a second slurry having a fourth temperature lower than the third temperature on to the polishing pad supplied with the second purging compound.

2. The method of claim 1, wherein each of the first purging compound and the second purging compound contains nitrogen ($N_2$).

3. The method of claim 2, wherein the second purging compound contains liquid nitrogen.

4. The method of claim 1, wherein the first temperature is within a range of from 25° C. to 80° C.

5. The method of claim 1, wherein the third temperature is within a range of from 25° C. to 90° C.

6. The method of claim 1, wherein the second temperature is within a range of from −10° C. to 25° C.

7. The method of claim 1, wherein the fourth temperature is within a range of from −10° C. to 25° C.

8. The method of claim 1, wherein the supplying of the second purging compound is performed after the supplying of the first slurry is performed.

9. The method of claim 1, wherein each of a flow rate of the first purging compound and a flow rate of the second purging compound is within a range of from 100 LPM to 150 LPM.

10. A method for chemical mechanical polishing, comprising:
providing a polishing pad;
supplying a first purging compound having a first temperature onto the polishing pad;
performing a first polishing process on a wafer using the polishing pad supplied with the first purging compound;
after performing the first polishing process, supplying a second purging compound having a second temperature lower than the first temperature onto the polishing pad; and
performing a second polishing process on the wafer using the polishing pad, supplied with the second purging compound.

11. The method of claim 10, wherein the performing of the first polishing process comprises supplying a first slurry having a third temperature onto the polishing pad supplied with the first purging compound, and polishing the wafer using the first slurry, and
wherein the performing of the second polishing process comprises supplying a second slurry having a fourth temperature lower than the third temperature onto the polishing pad supplied with the second purging, compound, and polishing the wafer using the second slurry.

12. The method of claim 10, wherein the wafer includes:
a substrate;
a material pattern disposed on the substrate, the material pattern including a plurality of trenches; and
a target layer disposed on the material pattern, the target layer filling each of the plurality of trenches.

13. The method of claim 12, wherein the first polishing process is performed until a thickness of the target layer is reduced to a predetermined thickness.

14. The method of claim 10, wherein the first polishing process is performed until the polishing pad reaches a predetermined temperature.

15. The method of claim 14, wherein the performing of the second polishing process comprises maintaining the predetermined temperature.

16. The method of claim 10, wherein a first time duration during which the first polishing process is performed is greater than a second time duration during which the second polishing process is performed.

17. The method of claim 16, wherein a ratio of the first time duration to a sum of the first time duration and the second time duration is within a range of from 70% to 95%.

* * * * *